United States Patent [19]

Chao et al.

[11] Patent Number: 5,213,886
[45] Date of Patent: May 25, 1993

[54] CURABLE DIELECTRIC POLYPHENYLENE ETHER-POLYEPOXIDE COMPOSITIONS

[75] Inventors: Herbert S. Chao; Robert E. Colborn; James R. Presley, all of Schenectady; Jana M. Whalen, Clifton Park, all of N.Y.; Michael J. Davis, Coshocton; James E. Tracy, Glenford, both of Ohio; Edward F. Chu, Mountain View, Calif.

[73] Assignee: General Electric Company, Schenectady, N.Y.

[21] Appl. No.: 902,219

[22] Filed: Jun. 22, 1992

Related U.S. Application Data

[60] Division of Ser. No. 460,430, Jan. 3, 1990, Pat. No. 5,162,450, which is a continuation-in-part of Ser. No. 312,850, Feb. 17, 1989, abandoned.

[51] Int. Cl.$^5$ .................. D04H 1/64; B32B 15/08; B32B 17/04
[52] U.S. Cl. .................. 428/288; 428/209; 428/289; 428/392; 428/901; 523/427; 523/428; 523/429; 523/433; 525/396
[58] Field of Search ............... 523/427, 428, 429, 433; 525/391, 396, 524; 428/209, 288, 289, 392, 901

[56] References Cited

U.S. PATENT DOCUMENTS

| | | | |
|---|---|---|---|
| 3,367,978 | 2/1968 | White | 528/176 |
| 3,367,990 | 2/1968 | Bremmer | 525/524 |
| 3,468,824 | 9/1969 | Williams | 525/524 |
| 3,689,444 | 9/1972 | Wolfe | 525/524 |
| 3,812,214 | 5/1974 | Markovitz | 525/524 |
| 4,137,275 | 1/1979 | Smith et al. | 525/524 |
| 4,661,559 | 4/1987 | Gardner et al. | 525/65 |
| 4,757,117 | 7/1988 | Moss | 525/524 |
| 4,853,423 | 8/1989 | Walles et al. | 523/428 |
| 4,975,319 | 12/1990 | Walles et al. | 428/265 |
| 5,001,010 | 3/1991 | Chao et al. | 525/396 |
| 5,043,367 | 8/1991 | Hallgren et al. | 523/429 |

FOREIGN PATENT DOCUMENTS

| | | | |
|---|---|---|---|
| 211147 | 2/1987 | European Pat. Off. | 525/396 |
| 374514 | 11/1989 | European Pat. Off. | |
| 53-35981 | 9/1978 | Japan | 525/396 |
| 58-69052 | 4/1983 | Japan | |
| 58-219217 | 12/1983 | Japan | |
| 61-246224 | 11/1986 | Japan | 525/396 |
| 62-187764 | 8/1987 | Japan | 525/396 |
| 0124825 | 1/1989 | Japan | |

*Primary Examiner*—Robert E. Sellers
*Attorney, Agent, or Firm*—William H. Pittman

[57] ABSTRACT

Curable compositions contain a low molecular weight polyphenylene ether and a polyepoxide composition containing brominated and non-brominated bisphenol polyglycidyl ethers, in combination with further components including specific catalysts. Said compositions are preferably free from hardeners for epoxy resins. They may be used in the preparation of bonding sheets which are useful in the manufacture of multilayer printed circuit assemblies and which have excellent physical and electrical properties.

15 Claims, No Drawings

CURABLE DIELECTRIC POLYPHENYLENE ETHER-POLYEPOXIDE COMPOSITIONS

This application is a division of copending application Ser. No. 07/460,430, filed Jan. 3, 1990 which is a continuation-in-part of application Ser. No. 07/312,850, filed Mar. 10, 1989, now U.S. Pat. No. 5,162,450, now abandoned.

This invention relates to resinous compositions useful as dielectrics, and more particularly to polyphenylene ether-polyepoxide compositions having favorable properties including solvent resistance and solderability.

A number of polyphenylene ether-polyepoxide compositions having favorable dielectric properties, and supposedly being useful in circuit board manufacture, are known. However, for the most part these have not attained wide commercial use because of deficiencies in one or more properties. Thus, while the polyphenylene ethers are excellent dielectrics and the properties of combinations thereof with polyepoxides are favorable in this respect, they lack solvent resistance which is required in order for the circuit board to survive cleaning. Other deficiencies are found in areas such as flammability, solderability and resistance to high temperatures.

In addition to excellent dielectric properties, resinous compositions to be used for printed circuit board manufacture should be highly flame-retardant. A V-1 rating, as determined by Underwriters Laboratories test procedure UL-94, is universally required with V-0 usually being necessary. The V-0 rating requires a flame-out time (FOT) of not more than 10 seconds in any trial and a cumulative FOT of not more than 50 seconds for five samples. As a practical matter, a maximum cumulative FOT of 35 seconds is often mandated by purchasers.

The fabricated board should not lose substantial weight and its surface should not be appreciably marred by contact with methylene chloride, a solvent commonly used for cleaning. Since conductive connections with the printed circuit are typically made by soldering, the board must be solder-resistant as evidenced by the lowest possible percent increase in thickness (Z-axis expansion) when exposed to liquid solder at 288° C.

In Japanese Kokai 58/69052, combinations of polyphenylene ethers with various types of polyepoxides are disclosed. The latter include epoxy novolak resins and polyglycidyl ethers of such compounds as bisphenol A and 2,2-bis(3,5-dibromo-4-hydroxyphenyl)propane (tetrabromobisphenol A). Curing of these compositions is achieved by contact with various known curing agents, including amines. The cured compositions, however, have been found to be seriously deficient in solvent resistance and, in certain cases, in solderability.

Copending, commonly owned applications Ser. No. 219,106, filed Jul. 14, 1988, and Serial No. (RD-19038], disclose curable polyphenylene ether-polyepoxide compositions incorporating partially cured ("upstaged") products comprising halogen-free bisphenol polyglycidyl ethers and certain compounds containing bromine as aryl substituents, which may be employed as such or as partially cured ("upstaged") products. Cured materials prepared therefrom have utility for laminate and circuit board production. They may also contain such other materials as halogen-free epoxidized novolaks and non-epoxidized novolaks, the latter serving as hardeners.

Such compositions have the properties necessary for the preparation of circuit boards. Those free from such materials as the above-described novolaks are also useful for bonding sheet production. Bonding sheets are employed when a multilayer structure is desired, involving etching of numerous printed circuits followed by their lamination into a single unit. For this purpose, a fiber-reinforced resinous bonding sheet is employed to separate the etched copper circuitry on two successive circuit boards, with the desired connections being made through the bonding sheet.

The bonding sheet composition must generally have a relatively high resin loading, since the resin must completely fill the voids created during the etching of circuits in the printed circuit boards. Extended cure time is also necessary, in order that the required flow may be achieved before curing is initiated. The formulation must be compatible with the base material in the circuit board. Flexibility is also preferred in a bonding sheet, unlike laminates for circuit boards in which stiffness is required.

Finally, bonding sheet resin compositions must have a substantially higher flow rate when melted under low pressure than a composition employed in circuit board manufacture, to facilitate filling of the aforementioned voids. The previously disclosed and claimed materials are often not entirely satisfactory in this regard, because of relatively low flow rates.

The present invention provides a series of resinous compositions which comprise polyepoxides, polyphenylene ethers and various catalysts, flame retardants and other constituents. When used to impregnate suitable fibrous reinforcing materials such as glass fiber cloth, they furnish compatible prepregs having a high flow rate and relatively long curing time, making them particularly suitable for bonding sheet preparation. (As used herein, "prepreg" means a curable article comprising a substrate impregnated with an uncured or partially cured resinous material.) Said compositions are readily soluble in organic solvents, facilitating impregnation. The cured materials prepared therefrom are highly solder resistant, solvent resistant and flame retardant, and have excellent dielectric properties and dimensional stability at high temperatures.

In one of its aspects, the invention includes curable compositions containing at least about 5% chemically combined bromine and comprising:
(I) about 30–60% of at least one polyphenylene ether having a number average molecular weight in the range of about 3,000–15,000;
(II) about 30–60% of at least one of:
  (A) polyepoxide compositions comprising at least one bisphenol polyglycidyl ether having an average of at most one aliphatic hydroxy group per molecule or a mixture comprising said bisphenol polyglycidyl ether and at least one bisphenol, said composition containing about 10–30% bromine as aryl substituents; and
  (B) partial condensation products of said polyepoxide compositions;
(III) a catalytically effective amount of at least one of imidazoles and arylene polyamines; and
(IV) a cocatalytically effective amount of zinc or aluminum in the form of a salt which is soluble or stably dispersible in said curable composition;
said composition being dissolved in an effective amount of an inert organic solvent;
all percentages being by weight and based on the total of components I and II.

For use in bonding sheet preparation, it is highly preferred that the curable compositions of this invention be free from hardeners for epoxy resins. Such hardeners are known in the art; their role in epoxy resin compositions is typically to cure the resins by reaction in stoichiometric or near-stoichiometric amounts, as opposed to epoxy cure catalysts which are presently in catalytic amounts and which cause curing by catalyzing interreaction between resin molecules. Hardeners are typically phenols, carboxylic acid derivatives and the like. Their absence is preferred since curing in their presence may occur too rapidly to allow sufficient flow of the bonding sheet resin to fill all voids in the circuit assembly before the resin becomes thermoset.

The polyphenylene ethers useful as component I in the compositions of this invention comprise a plurality of structural units having the formula

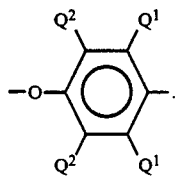 (I)

In each of said units independently, each $Q^1$ is independently halogen, primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-, 3- or 4-methylpentyl and the corresponding heptyl groups. Examples of secondary lower alkyl groups are isopropyl, sec-butyl and 3-pentyl. Preferably, any alkyl radicals are straight chain rather than branched. Most often, each $Q^1$ is alkyl or phenyl, especially C1-4 alkyl, and each $Q^2$ is hydrogen.

Both homopolymer and copolymer polyphenylene ethers are included. Suitable homopolymers are those containing, for example, 2,6-dimethyl-1,4-phenylene ether units. Suitable copolymers include random copolymers containing such units in combination with (for example) 2,3,6-trimethyl-1,4-phenylene ether units. Many suitable random copolymers, as well as homopolymers, are disclosed in the patent literature.

Also included are polyphenylene ethers containing moieties which modify properties such as melt viscosity and/or impact strength. Such polymers are described in the patent literature and may be prepared by grafting onto the polyphenylene ether in known manner such non-hydroxy-containing vinyl monomers as acrylonitrile and vinylaromatic compounds (e.g., styrene), or such non-hydroxy-containing polymers as polystyrenes and elastomers. The product typically contains both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, heterocycles and formals.

The polyphenylene ethers are typically prepared by the known oxidative coupling of at least one corresponding monohydroxyaromatic compound. Particularly useful and readily available monohydroxyaromatic compounds are 2,6-xylenol (wherein each $Q^1$ is methyl and each $Q^2$ is hydrogen), whereupon the polymer may be characterized as a poly(2,6-dimethyl-1,4-phenylene ether), and 2,3,6-trimethylphenol (wherein each $Q^1$ and one $Q^2$ are methyl and the other $Q^2$ is hydrogen).

Particularly useful polyphenylene ethers for the purposes of this invention are those which comprise molecules having aminoalkyl-substituted end groups, as described in numerous patents and publications. Such molecules frequently constitute a substantial proportion of the polyphenylene ether, typically as much as about 90% by weight. Polymers of this type may be obtained by incorporating an appropriate primary or secondary monoamine as one of the constituents of the oxidative coupling reaction mixture.

A variety of catalyst systems are known for the preparation of polyphenylene ethers by oxidative coupling. There is no particular limitation as to catalyst choice and any of the known catalysts can be used. For the most part, they contain at least one heavy metal compound such as a copper, manganese or cobalt compound, usually in combination with various other materials.

A first class of preferred catalyst systems consists of those containing a copper compound. Such catalysts are disclosed, for example, in U.S. Pat. Nos. 3,306,874, 3,306,875, 3,914,266 and 4,028,341. They are usually combinations of cuprous or cupric ions, halide (i.e., chloride, bromide or iodide) ions and at least one amine.

Catalyst systems containing manganese compounds constitute a second preferred class. They are generally alkaline systems in which divalent manganese is combined with such anions as halide, alkoxide or phenoxide. Most often, the manganese is present as a complex with one or more complexing and/or chelating agents such as dialkylamines, alkanolamines, alkylenediamines, o-hydroxyaromatic aldehydes, o-hydroxyazo compounds, ω-hydroxyoximes (monomeric and polymeric), o-hydroxyaryl oximes and β-diketones. Also useful are known cobalt-containing catalyst systems. Suitable manganese and cobalt-containing catalyst systems for polyphenylene ether preparation are known in the art by reason of disclosure in numerous patents and publications.

Particularly useful polyphenylene ethers for the purposes of this invention are those which comprise molecules having at least one of the end groups of the formulas

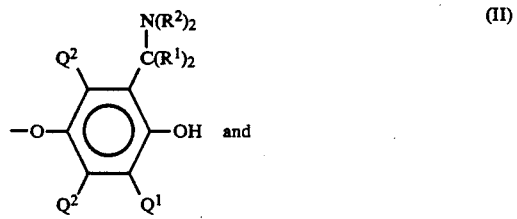 (II)

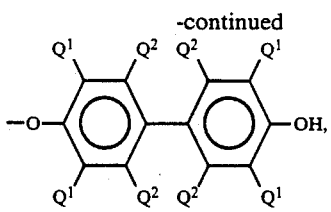

(III)

wherein $Q^1$ and $Q^2$ are as previously defined; each $R^1$ is independently hydrogen or alkyl, with the proviso that the total number of carbon atoms in both $R^1$ radicals is 6 or less; and each $R^2$ is independently hydrogen or a $C_{1-6}$ primary alkyl radical. Preferably, each $R^1$ is hydrogen and each $R^2$ is alkyl, especially methyl or n-butyl.

Polymers containing the aminoalkyl-substituted end groups of formula II may be obtained by incorporating an appropriate primary or secondary monoamine as one of the constituents of the oxidative coupling reaction mixture, especially when a copper- or manganese-containing catalyst is used. Such amines, especially the dialkylamines and preferably di-n-butylamine and dimethylamine, frequently become chemically bound to the polyphenylene ether, most often by replacing one of the α-hydrogen atoms on one or more $Q^1$ radicals. The principal site of reaction is the $Q^1$ radical adjacent to the hydroxy group on the terminal unit of the polymer chain. During further processing and/or blending, the aminoalkyl-substituted end groups may undergo various reactions, probably involving a quinone methide-type intermediate of the formula

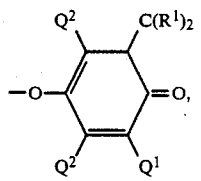

(IV)

with numerous beneficial effects often including an increase in impact strength and compatibilization with other blend components. Reference is made to U.S. Pat. Nos. 4,054,553, 4,092,294, 4,477,649, 4,477,651 and 4,517,341, the disclosures of which are incorporated by reference herein.

Polymers with 4-hydroxybiphenyl end groups of formula III are typically obtained from reaction mixtures in which a by-product diphenoquinone of the formula

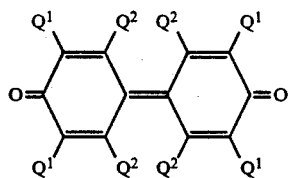

(V)

is present, especially in a copper-halide-secondary or tertiary amine system. In this regard, the disclosure of U.S. Pat. No. 4,447,649 is again pertinent as are those of U.S. Pat. Nos. 4,234,706 and 4,482,697, which are also incorporated by reference herein. In mixtures of this type, the diphenoquinone is ultimately incorporated into the polymer in substantial proportions, largely as an end group.

In many polyphenylene ethers obtained under the above-described conditions, a substantial proportion of the polymer molecules, typically constituting as much as about 90% by weight of the polymer, contain end groups having one or frequently both of formulas II and III. It should be understood, however, that other end groups may be present and that the invention in its broadest sense may not be dependent on the molecular structures of the polyphenylene ether end groups.

It will be apparent to those skilled in the art from the foregoing that apart from the molecular weight considerations dealt with hereinafter, the polyphenylene ethers contemplated for use in the present invention include all those presently known, irrespective of variations in structural units or ancillary chemical features.

For the purposes of this invention, the polyphenylene ether has a number average molecular weight within the range of about 3,000–15,000, as determined by gel permeation chromatography. Lower molecular weight materials produce curable compositions having superior flow characteristics which enable them to rapidly fill all voids in the etched printed circuit boards when employed as bonding sheets. The molecular weight is preferably in the range of about 5,000–10,000. Intrinsic viscosities of such polyphenylene ethers are preferably in the range of about 0.15–0.35 and most preferably about 0.16–0.30 dl./g., as measured in chloroform at 25° C.

Low molecular weight polyphenylene ethers of this type are not readily available as commercial products at present, and the preparation of such polymers especially for bonding sheet applications would be burdensome and expensive. Therefore, it is preferred to prepare such low molecular weight polymers from commercially available polyphenylene ethers, typically having a number average molecular weight in the range of about 15,000–25,000. Such conversion can be conveniently achieved by redistribution reactions.

It is within the scope of the invention to perform the redistribution reaction in situ during preparation of the polyphenylene ether; reference is made, for example, to U.S. Pat. No. 4,521,584. However, subsequent redistribution is generally preferred, as described in U.S. Pat. Nos. 3,367,978 and 4,234,706 and in White et al., J. Oro. Chem., 34, 297–303 (1969). For this purpose, a solution of the polyphenylene ether in a suitable solvent may be heated at a temperature in the range of about 50°–110° C. in the presence of a diphenoquinone such as 3,3',5,5'-tetramethyl-4,4'-diphenoquinone.

An alternative redistribution process involves reaction with a phenol in the presence of an oxidizing agent which is soluble in the reaction mixture, typically a diphenoquinone or an organic peroxide such as benzoyl peroxide. The preferred phenols for this purpose are bisphenols; that is, compounds containing two hydroxyphenyl groups attached to an aliphatic or cycloaliphatic moiety, which may also contain aromatic substituents.

For the most part, the suitable bisphenols have the formula $$HO-A^1-Y-A^2-OH \qquad (VI)$$

wherein each of $A^1$ and $A^2$ is a monocyclic divalent aromatic radical and Y is a single bond or a bridging radical in which one or two atoms separate $A^1$ from $A^2$. The $O-A^1$ and $A^2-O$ bonds in formula VI are usually in the meta or para positions of $A^1$ and $A^2$ in relation to Y.

The $A^1$ and $A^2$ values may be unsubstituted phenylene or substituted derivatives thereof, illustrative substituents (one or more) being alkyl, nitro, alkoxy and the Bisphenol polyglycidyl ethers are prepared conventionally by the reaction of bisphenols with epichlorohydrin. They may be represented by the formula

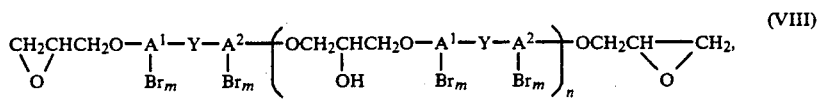

(VIII)

Wherein m is 0–4, n has an average value up to 1 and $A^{1-2}$ and Y are as previously defined.

In most instances, component II comprises at least two bisphenol polyglycidyl ethers, one being brominated (m is 1–4, preferably 2) to provide flame retardancy and the other based on the required bromine content for component II of about 10–30%. The preferred materials are commercially available reaction products of epichlorohydrin and bisphenol A, including EPON 825 (n =0) and EPON 828 (n =about 0.14), available from Shell Chemical Co., and similar products prepared from epichlorohydrin and tetrabromobisphenol A.

like. Unsubstituted phenylene radicals are preferred. Each of $A^1$ and $A^2$ may, for example, be o- or m-phenylene and the other p-phenylene, but both are preferably p-phenylene.

The Y value may be a single bond but is usually a bridging radical in which one or two atoms, preferably one, separate $A^1$ from $A^2$. It is most often a hydrocarbon radical and particularly a saturated radical such as methylene, cyclohexylmethylene, ethylene, isopropylidene, neopentylidene, cyclohexylidene or cyclopentadecylidene, especially a gem-alkylene (alkylidene) radical and most preferably isopropylidene. Also included, however, are radicals which contain atoms other than carbon and hydrogen; for example, oxy or thio. An especially preferred bisphenol is bisphenol A in which $A^1$ and $A^2$ are each p-phenylene and Y is isopropylidene.

Redistribution by this method may be easily carried out immediately prior to incorporation of the polyepoxy compounds and other reagents described hereinafter to form the curable composition of the invention. The bisphenol and oxidizing agent are ordinarily employed in relatively small amounts, usually less than about 5% and most often about 0.5–3.0% by weight based on polyphenylene ether. The use of these small amounts results in the desired decrease in molecular weight of the polyphenylene ether, as opposed to its degradation into oligomers of much lower molecular weight as principally described in the publications cited hereinabove.

Redistributed polyphenylene ethers prepared by the action of bisphenols on polyphenylene ethers, as described hereinabove, are characterized by the formula

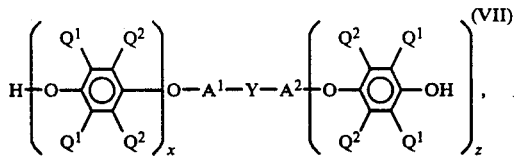

(VII)

wherein $Q^{1-2}$, $A^{1-2}$ and Y are as previously defined, x is 0 or a positive number and z is a positive number. In most instances, x +z is about 25–125; the value of x is most often 0.

Component II may be either (A) a composition comprising polyepoxides or mixtures thereof with bisphenols or (B) a partial condensation product thereof. Mixtures of A and B may also be employed. The polyepoxide compositions used therein, either as constituents or reactants, include at least one bisphenol polyglycidyl ether. Mixtures of such ethers are usually employed, part of the components of said mixture being halogen-free and the balance thereof containing bromine as aryl substituents. The total amount of bromine in component II is about 10–30% by weight.

It is also possible to employ brominated bisphenols in place of the polyglycidyl ethers thereof. However, brominated bisphenols tend to decompose at temperatures above about 200° C., which include the curing temperatures of the curable compositions of this invention. Therefore, it is preferred for the brominated compound to be a polyglycidyl ether when component II is a simple mixture. When component II is a partial condensation product, which may be formed at temperatures substantially lower than 200° C., the brominated compound is preferably a bisphenol by reason of availability and relatively low cost.

Other polyepoxy compounds may also be present in or used for the preparation of component II, especially at least one halogen-free epoxidized novolak. Suitable novolaks for use as precursors therefor are known in the art and are typically prepared by the reaction of formaldehyde with a hydroxyaromatic compound such as phenol (which is often preferred), cresol or t-butylphenol. The novolak then undergoes reaction with an epoxy reagent such as epichlorohydrin to produce the resin useful in component II.

Various epoxidized novolaks are commercially available, and any of then may be used according to the invention. It is usually strongly preferred that the epoxidized novolak contain substantially no free phenolic hydrogen atoms.

When component II is a mixture, it usually comprises about 30–60% by weight of the brominated compound and about 5–20% of the epoxidized novolak (when present), with the balance being the non-brominated bisphenol polyglycidyl ether.

The partial condensation products suitable for use as component II may be prepared by heating the mixture of compounds, as hereinabove described, at a temperature in the range of about 125°–225° C., preferably about 150°–200° C. and most preferably about 160°–190° C., in the presence of a catalytic amount of at least one basic reagent. Said mixture preferably consists essentially of said reagents; that is, they are the only ones contributing to the novel and essential properties thereof.

The triarylphosphines, especially triphenylphosphine, are the preferred basic reagents by reason of their effectiveness at low levels, low tendency to cause side reactions and harmlessness when they remain present after the reaction is complete. They are usually employed in the amount of about 0.1–0.5% by weight. The reaction is preferably conducted in an inert atmosphere such as nitrogen, especially when a triarylphosphine is employed as catalyst. An inert organic solvent having a boiling point no higher than about 125° C., usually an aromatic hydrocarbon such as toluene, may be employed but usually provides no advantage at this point.

Said partial condensation products most often comprise about 25–35% brominated compound and about 15–25% epoxidized novolak, with the balance being the non-brominated biphenol polyglycidyl ether. Lower concentrations of brominated compound or novolak cause an unacceptable decrease in solvent resistance and/or flame resistance. An increase in brominated compound may yield an incompatible material. The preferred proportion of brominated compound is in the range of 28–32%.

The structure of the partial condensation product thus obtained is not fully known. It is believed to be an "upstaged" (i.e., partially cured) composition derived from the compounds of formula II, in which the brominated moieties form part of the molecular structure. The epoxidized novolak may also be chemically bound into the molecules of the upstaged composition in varying proportions.

The preparation of the partial condensation products is illustrated by the following example.

EXAMPLE 1

A mixture of 50 parts by weight of bisphenol A diglycidyl ether, 30 parts of tetrabromobisphenol A, 20 parts of an epoxy novolak resin commercially available from Ciba-Geigy under the grade designation "EPN 1138"and 0.2 part of triphenylphosphine was heated at 165° C. for one hour in a nitrogen atmosphere, with stirring. The product was the desired upstaged composition and contained 17.6% bromine.

Component III is at least one compound selected from the group consisting of imidazoles and arylene polyamines. Any of such imidazoles and polyamines known in the art to be useful as curing agents for epoxy resins may be employed. Particularly useful imidazoles are imidazole, 1,2-dimethylimidazole, 2-methylimidazole, 2-heptadecylimidazole and 1-(2-cyanoethyl)-2-phenylimidazole.

Commercially available imidazole-arylene polyamine mixtures are often preferred. The especially preferred mixtures contain phenylenediamines, most often m-phenylenediamine, usually in combination with a dipolar aprotic solvent such as N-methylpyrrolidone.

The amount of component III is a catalytically effective amount to achieve curing, preferably rapidly after solvent removal. Most often, it is at least 4.5 milliequivalents of basic nitrogen per 100 parts of total curable composition, including any basic nitrogen present in the polyphenylene ether (mostly as aminoalkyl-substituted end groups). Thus, when a polyphenylene ether essentially free from basic nitrogen is employed the proportion of component III must be increased. (For the purpose of this invention, the equivalent weight of an imidazole is equal to its molecular weight and that of a diamine is half its molecular weight.)

Component IV is chemically combined zinc or aluminum, preferably zinc, furnished in the form of a salt which is soluble or stably dispersible in the curable composition. Salts of diketones in which one carbon atom separates the carbonyl groups, especially acetylacetonates, and salts of fatty acids, especially octanoates and stearates, are examples of suitable forms of zinc or aluminum for this purpose. In general, the fatty acid salts are preferred when component III contains alkylene polyamines, and diketone salts are preferred when component III is entirely imidazole.

Under certain conditions, acetylacetonates such as zinc acetylacetonate can form hydrates which readily lose acetylacetone and become insoluble in the organic systems used for laminate preparation. Therefore, it may be necessary to take steps to maintain the zinc or aluminum in stable dispersion.

One means for doing this is to subject the composition to continuous agitation; however, this is generally not practical. A better method is to form an alcoholate of the acetylacetonate, as by reaction with methanol. Said alcoholate loses alcohol rather than acetylacetone under similar conditions, remaining in solution or homogeneous suspension.

Another method for maximizing homogeneity is to employ a fatty acid salt. Still another method is to employ a titanium compound as a compatibilizer, as disclosed hereinafter.

Component IV is employed in a cocatalytically effective amount, and generally also serves to improve solvent resistance and flame retardancy. About 0.1–1.0% of zinc or aluminum, based on total curable composition, is usually present.

The curable compositions of the invention are dissolved in an effective amount of an inert organic solvent, typically to a solute content of about 40–75% by weight. The identity of the solvent is not critical, provided it may be removed by suitable means such as evaporation. Aromatic hydrocarbons, especially toluene, are preferred. The order of blending and dissolution is also not critical; however, in order to avoid premature curing, catalyst and hardener components should generally not be brought initially into contact with polyphenylene ether and polyepoxides at a temperature above about 60° C. Proportions of components and bromine herein do not include solvent.

The preferred proportions of bromine and the various components in the curable compositions of the invention, based on total curable composition (excluding solvent), are:

Bromine —about 5–15%;
Component I —about 40–60%;
Component II —about 40–55%;
Component III —about 10–30 meq. of basic nitrogen (total);
Component IV —about 0.2–0.5% Zn or Al.

Various optional materials may also be present. They include inert, particulate fillers such as talc, clay, mica, silica, alumina and calcium carbonate. In addition, the bromine content of the curable composition may be supplied in part by materials such as alkyl tetrabromophthalates and/or epichlorohydrin reaction products with mixtures of bisphenol A and tetrabromobisphenol A. The alkyl tetrabromophthalates also serve as plasticizers and flow improvers. Fabric wettability enhancers, chiefly polar liquids such as n-butyl alcohol, methyl ethyl ketone and tetrahydrofuran, may be advantageous under certain conditions. The compositions may also include such materials as antioxidants, thermal and ultraviolet stabilizers, lubricants, anti-static agents, dyes and pigments.

The presence of flame retardancy synergists, such as antimony pentoxide, is often preferred. When present, it must be maintained in stable dispersion. This may be done by agitation and/or combination with a suitable dispersing agent, of which many are known in the art. The proportion of antimony pentoxide is usually up to about 5 parts per 100 parts of components I-IV.

One preferred dispersing agent is a polymer which is compatible with the resinous constituents of the curable composition but is substantially non-reactive under the conditions employed, typically a polyester. More powerful dispersing agents, such as amines, may be required when component IV is a fatty acid salt, since such salts may otherwise form insoluble complexes with antimony pentoxide.

A material whose presence in minor amount may improve the solvent resistance and compatibility of the curable composition, and is therefore preferred, is at least one aliphatic tris(dialkylphosphato)titanate. Suitable phosphatotitanates are known in the art and commercially available. They may be represented by the formula

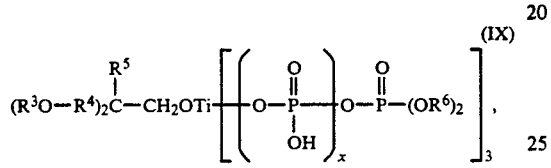

wherein $R^3$ is $C_{2-6}$ primary or secondary alkyl or alkenyl and preferably alkenyl, $R^4$ is $C_{1-3}$ alkylene and preferably methylene, $R^5$ is $C_{1-5}$ primary or secondary alkyl, $R^6$ is $C_{5-12}$ primary or secondary alkyl and x is from 0 to about 3 and is preferably 0 or 1. Most preferably, $R^3$ is allyl, $R^5$ is ethyl, $R^6$ is octyl and x is 0. The phosphatotitanate is most often present in the amount of about 0.1-1.0 part by weight per 100 parts of the resinous composition.

The present invention includes all compositions which comprise the above-described constituents, including those containing unspecified ingredients other than hardeners. However, the compositions which are often preferred consist essentially of components I-IV; that is, said components are the only ones which materially affect the basic and novel characteristics of the compositions.

Another aspect of the invention is prepregs comprising a fibrous substrate (woven or non-woven) such as glass, quartz, polyester, polyamide, polypropylene, cellulose, nylon or acrylic fibers, preferably glass, impregnated with the curable composition and obtained upon removal of the solvent therefrom by evaporation or the like. For use as bonding sheets, the prepregs are usually partially cured after preparation. This is particularly true when component II is a mixture rather than a partial condensation product. Partial curing may be achieved by heating the curable composition at a temperature in the range of about 130°-175° C. for a period of about 1-5 minutes. The partially cured prepregs thus obtained may be easily handled and shipped.

In use, the bonding sheets are sandwiched between two printed circuit boards comprising metal-clad laminates into which circuits have been etched. The metal cladding is most often copper. A plurality of bonding sheets may be employed to provide multilayer structures. Curing is then effected at temperatures typically in the range of about 200°-250° C. and pressures in the range of about 0.1-0.2 kg./cm².

Accordingly, another aspect of the invention is multilayer circuit assemblies comprising at least two printed circuit boards separated by a cured composition prepared from the above-described bonding sheets. As previously mentioned, said assemblies are characterized by excellent dielectric properties, solderability, flame retardancy and resistance to high temperature conditions and solvents.

The preparation of the curable and cured compositions and articles of this invention is illustrated by the following examples. All parts and percentages are by weight unless otherwise indicated.

In the examples, "precursor polyphenylene ether" was a poly(2,6-dimethyl-1,4-phenylene ether) having a number average molecular weight of about 20,000, an intrinsic viscosity in chloroform at 25° C. of 0.40 dl./g. and a nitrogen content of about 960 ppm. Other constituents were as follows:

EPOLITE —a mixture of 1,2-dimethylimidazole, m-phenylenediamine and N-methylpyrrolidone having an average equivalent weight of about 130.

EPN 1138 —an epoxy novolak resin commercially available from Ciba-Geigy.

Phosphatotitanate —a commercially available compound of formula VII wherein $R^1$ is allyl, $R^2$ is methylene, $R^3$ is ethyl, $R^4$ is octyl and x is 0.

ADP-480 —a commercially available colloidal dispersion comprising about 75% antimony pentoxide coated with an amine powder and dispersed in toluene.

EXAMPLES 2-14 3

A solution of 50 parts of precursor polyphenylene ether in 139 parts of toluene was heated at 95° C., with stirring, and there were added 0.5 part of bisphenol A followed by 0.5 part of benzoyl peroxide. The mixture was heated and stirred for 1-½ hours, yielding a solution of equilibrated polyphenylene ether having a number average molecular weight of about 11,400 and an intrinsic viscosity of about 0.33.

To two portions of the solution were added other materials to produce compositions with the proportions listed in Table I, excluding toluene.

TABLE I

| | Example | |
|---|---|---|
| | 2 | 3 |
| Component I, % | 50.13 | 48.22 |
| Component II, %: | | |
| Product of Example 1 | 40.10 | 38.57 |
| EPN 1138 | 5.01 | 9.64 |
| Component III, %: | | |
| EPOLITE | 1.75 | — |
| 2-Heptadecylimidazole | — | 1.64 |
| Component IV, %: | | |
| Zinc stearate | 3.01 | — |
| Zinc acetylacetonate | — | 1.93 |
| ADP-480, parts* | 2.00 | — |
| Phosphatotitanate, parts* | 0.50 | 0.48 |
| Bromine, % | 7.12 | 6.78 |
| Zinc, % | 0.31 | 0.48 |
| Nitrogen, meq. per 100 parts | 16.9 | 18.0 |

*Per 100 parts of components I-IV.

Swatches of electrical grade woven fiberglass cloth were dipped into the toluene solutions and air dried at about 120°-160° C. to remove solvent and yield composite prepregs which were then cured by compression molding for 5-10 minutes at about 230° C. and about 49.2 kg./cm.². The cured compositions had good solvent resistance and solderability, the latter being demonstrated by very low Z-axis expansions.

EXAMPLES 4-8

Solutions in toluene (Examples 5-8) or in a 9:1 mixture of toluene and tetrahydrofuran (Example 4) were prepared in accordance with Examples 2-3. The solute concentration of each solution was about 45%. Prepregs were prepared and cured substantially as described in Examples 2-3 and their properties were evaluated by standard methods. The relevant parameters and test results are given in Table II.

TABLE II

|  | 4 | 5 | 6 | 7 | 8 |
|---|---|---|---|---|---|
| Component I: | | | | | |
| Bisphenol A, %* | 2.0 | 2.0 | 1.0 | 2.5 | 2.0 |
| Benzoyl peroxide, %* | 2.8 | 2.0 | 1.0 | 2.5 | 2.0 |
| Mn | — | 6,800 | 11,400 | — | 6,800 |
| Int. viscosity, dl./g. | 0.25 | 0.25 | 0.33 | — | 0.25 |
| Percent | 51.84 | 55.58 | 42.69 | 47.51 | 47.34 |
| Component II, %: | | | | | |
| Bisphenol A diglycidyl ether | 10.10 | 20.87 | 20.54 | 23.75 | 23.67 |
| Tetrabromobisphenol A diglycidyl ether | 35.47 | 20.77 | 20.54 | 23.75 | 23.67 |
| EPN 1138 | — | — | 10.67 | — | — |
| Component III: EPOLITE, % | 0.68 | 0.73 | 1.49 | 1.38 | 1.72 |
| Component IV: Zinc stearate, % | 1.91 | 2.05 | 4.06 | 3.61 | 3.59 |
| ADP-480, parts** | — | 4.1 | 4.1 | 3.6 | 3.6 |
| Phosphatotitanate, parts** | 0.49 | 0.53 | 0.53 | 0.53 | 0.53 |
| Bromine, % | 18.1 | 10.1 | 10.0 | 11.6 | 11.6 |
| Zinc, % | 0.20 | 0.21 | 0.42 | 0.38 | 0.37 |
| Nitrogen, meq. per 100 parts | 8.8 | 9.4 | 14.4 | 13.9 | 16.5 |
| Water absorption (24 hrs. soak at 23° C.), % | — | 0.05 | 0.05 | 0.06 | 0.10 |
| Flexural strength, MPa.: | | | | | |
| Longitudinal | — | — | 720.5 | — | 640.5 |
| Cross-sectional | — | — | 546.7 | — | 468.2 |
| Flexural modulus, GPa.: | | | | | |
| Longitudinal | — | — | 25.4 | — | 21.4 |
| Cross-sectional | — | — | 22.1 | — | 18.1 |
| Flammability | — | V-O | V-O | V-O | V-O |
| Dielectric constant at 1 MHz.: | | | | | |
| Untreated | — | — | 4.43 | — | 4.01 |
| After 24 hrs. in water at 23° C. | — | — | 4.50 | — | 4.04 |
| Dissipation factor at 1 MHz.: | | | | | |
| Untreated | — | — | 0.011 | — | 0.011 |
| After 24 hrs. in water at 23° C. | — | — | 0.014 | — | 0.013 |
| Solderability - sec. to blister at 288° C. | — | 31 | 60 | 139 | 60 |
| Methylene chloride absorption, % | — | — | 1.3 | — | 2.1 |

*Based on precursor polyphenylene ether.
**Per 100 parts of components I-IV.

What is claimed is:

1. A curable article comprising a fibrous substrate impregnated with a composition free from hardeners for epoxy resins, containing about 5-15% chemically combined bromine and consisting essentially of:
   (I) about 30-60% of at least one polyphenylene ether having a number average molecular weight in the range of about 3,000-15,000, said polyphenylene ether consisting essentially of structural units having the formula

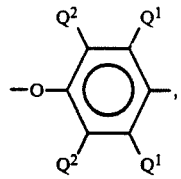

(I)

wherein in each of said units independently, each $Q^1$ is independently halogen, primary or secondary lower alkyl, phenyl, haloalkyl, aminoalkyl, hyrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$;

(II) about 30-60% of at least one of:
   (A) polyepoxide compositions comprising at least one bisphenol polyglycidly ether having an average of at most one aliphatic hydroxy group per molecule or a mixture comprising said bisphenol polyglycidyl ether and at least one bisphenol, said composition containing about 10-30% bromine as aryl substituents; and
   (B) partial condensation products of said polyepoxide compositions;
   (III) a catalytically effective amount of at least one of imidazoles and arylene polyamines; and
   (IV) about 0.2-1.0% of zinc in the form of a salt which is soluble or stably dispersible in said curable composition;
all percentages being by weight and based on total curable composition.

2. An article according to claim 1 wherein component II comprises compounds having the formula

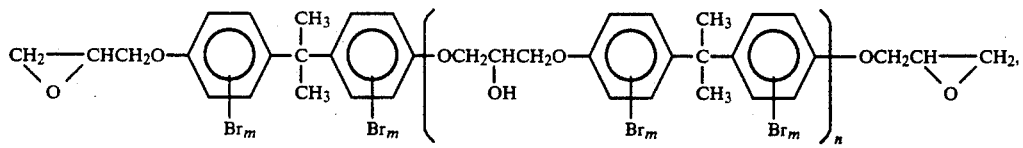

wherein m is 0-4 and n has an average value up to 1.

3. An article according to claim 2 wherein n is 0 and component I is a poly(2,6-dimehtyl-1,4-phenylene ether) having a number average molecular weight within the range of about 5,000-10,000.

4. An article according to claim 3 wherein the polyphenylene ether has the formula

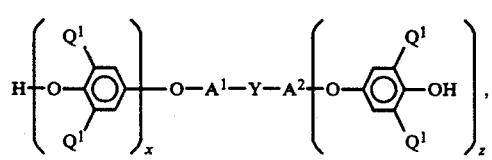

wherein in each unit independently, each $Q^1$ is methyl or $CH_2N(R^2)_2$, each $R^2$ is independently hydrogen or a $C_{1-6}$ primary alkyl radical, each of $A^1$ and $A^2$ is a monocyclic divalent aromatic radical, Y is a bridging radical in which one or two atoms separate $A^1$ from $A^2$, x is 0 or a positive number and z is a positive number.

5. A composition according to claim 4 wherein $A^1$ and $A^2$ are each p-phenylene and Y is isopropylidene.

6. A composition according to claim 5 wherein component III is at least one imidazole.

7. A composition according to claim 5 wherein component III is a mixture of at least one imidazole with at least one arylene polyamine.

8. A composition according to claim 5 wherein component IV is zinc acetylacetonate, zinc octanoate or zinc stearate.

9. A curable article comprising a fibrous substrate impregnated with a composition free from hardeners for epoxy resins, containing about 5-15% chemically combined bromine and consisting essentially of:

(I) about 30-60% of at least one polyphenylene ether having a number average molecular weight in the range of about 3,000-15,000, said polyphenylene ether consisting essentially of structural units having the formula

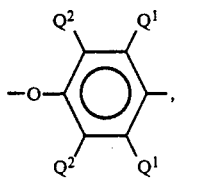

wherein in each of said units independently, each $Q^1$ is independently halogen, primary or secondary lower alkyl, phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydorcarbonoxy or halohydrocarbonoxy as defined for $Q^1$;

(II) about 30-60% of at least one of:
 (A) polyepoxide compositions comprising at least one bisphenol polyglycidyl ether having an average of at most one aliphatic hydroxy group per molecule or a mixture comprising said bisphenol polyglycidy ether and at least one bisphenol, said composition containing about 10-30% bromine as aryl substituents; and
 (B) partial condensation products of said polyepoxide compositions;

(III) a catalytically effective amount of at least one of imidazoles and arylene polyamines; and (IV) about 0.2-1.0% of zinc in the form of a salt which is soluble or stably dispersible in said curable composition;

all percentages being by weight and based on the total curable composition;

said composition also containing at least one aliphatic tris(dialkylphosphato)titanate of the formula

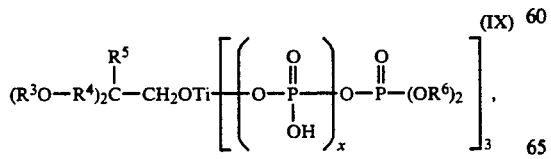

wherein $R^3$ is $C_{2-6}$ primary or secondary alkyl or alkenyl, $R^4$ is $C_{1-3}$ alkylene, $R^5$ is $C_{1-5}$ primary or secondary alkyl, $R^6$ is $C_{5-12}$ primary or secondary alkyl and x is from 0 to about 3, in the amount of about 0.1-1.0 part by weight per 100 parts of the resinous composition.

10. An article according to claim 9 wherein $R^3$ is allyl, $R^4$ is methylene, $R^5$ is ethyl, $R^6$ is octyl and x is 0 or 1.

11. A curable article comprising a fibrous substrate impregnated with a composition free from hardeners for epoxy resins, containing about 5-15% chemically combined bromine and consisting essentially of:

(I) about 30-60% of at least one polypehnylene ether having a number average molecular weight in the range of about 3,000-15,000, said polyphenylene ether consisting essentially of structural units having the formula

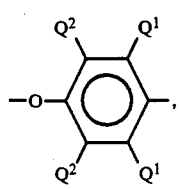

wherein in each of said units independently, each $Q^1$ is independently halogen, primary or secondary lower alkyl, phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$;

(II) about 30-60% of at least one of:
 (A) polyepoxide compositions comprising at least one bisphenol polyglycidyl ether having an average of at most one aliphatic hydroxy group per molecule or a mixture comprising said bisphenol polyglycidyl ether and at least one bisphenol, said composition containing about 10-30% bromine as aryl substituents; and
 (B) partial condensation products of said polyepoxide compositions;

(III) a catalytically effective amount of at least one of imidazoles and arylene polyamines; and (IV) about 0.2-1.0% of zinc in the form of a salt which is soluble or stably dispersible in said curable composition;

all percentages being by weight and based on the total curable composition;

said composition also containing up to about 5 parts, per 100 parts of components I-IV, of antimony pentoxide stably dispersed therein.

12. An article according to claim 1 wherein the substrate is glass fiber.

13. An article according to claim 5 wherein the substrate is glass fiber.

14. A multilayer circuit assembly comprising at least two printed circuit boards separated by a cured composition prepared by the application of heat and pressure to the article of claim 32.

15. A multilayer circuit assembly comprising at least two printed circuit boards separated by a cured composition prepared by the application of heat and pressure to the article of claim 13.

* * * * *